United States Patent
Schmogrow et al.

(10) Patent No.: US 11,044,015 B2
(45) Date of Patent: Jun. 22, 2021

(54) LOW SIGNAL TO NOISE RATIO SUBMARINE COMMUNICATION SYSTEM

(71) Applicant: Google LLC, Mountain View, CA (US)

(72) Inventors: Rene Schmogrow, San Jose, CA (US); Ralph Hofmeister, Los Altos, CA (US); Vijayanand Vusirikala, Palo Alto, CA (US); Valey Kamalov, Gainesville, FL (US); Mattia Cantono, Dublin (IE)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 16/358,192

(22) Filed: Mar. 19, 2019

(65) Prior Publication Data

US 2020/0162163 A1 May 21, 2020

Related U.S. Application Data

(60) Provisional application No. 62/770,008, filed on Nov. 20, 2018.

(51) Int. Cl.
*H04B 10/291* (2013.01)
*H04B 10/80* (2013.01)
(Continued)

(52) U.S. Cl.
CPC ......... *H04B 10/2914* (2013.01); *G02B 6/30* (2013.01); *G02B 6/4427* (2013.01); *H04B 10/808* (2013.01)

(58) Field of Classification Search
None
See application file for complete search history.

(56) References Cited

U.S. PATENT DOCUMENTS

| 4,886,334 | A | 12/1989 | Aoki |
| 6,560,010 | B1 | 5/2003 | DiJaili et al. |

(Continued)

FOREIGN PATENT DOCUMENTS

| EP | 1282246 B1 | 9/2010 |
| EP | 3113302 A1 | 1/2017 |

(Continued)

OTHER PUBLICATIONS

"Characteristics of regenerative optical fibre submarine cable systems; G.974 (Jun. 2004)", ITU-T Standard in Force (I), International Telecommunication Union, Geneva, CH, No. G.974 (Jun. 2004), Jun. 13, 2004 (Jun. 13, 2004), XP017401161. 21 pages.

(Continued)

*Primary Examiner* — Tina M Wong
(74) *Attorney, Agent, or Firm* — Lerner, David, Littenberg, Krumholz & Mentlik, LLP (57) ABSTRACT

Systems and methods of undersea optical communication are provided. An undersea optical amplifier assembly can include a water-tight housing and a photonic integrated circuit disposed within the housing. The photonic integrated circuit includes a plurality of optical fiber inputs, each configured to receive an end of a respective optical fiber of a first fiber optic cable bundle, and a plurality of optical fiber outputs. Each optical fiber output corresponds to a respective optical fiber input to form a fiber optic input-output pair, and is configured to receive an end of a respective optical fiber of a second fiber optic cable bundle. The photonic integrated circuit includes an optical amplifier optically coupled to each respective fiber optic input-output pair. The housing includes a first water-tight access port configured to receive the first fiber optic cable bundle, and a second water-tight access port configured to receive a second fiber optic cable bundle.

28 Claims, 5 Drawing Sheets

(51) Int. Cl.
*G02B 6/30* (2006.01)
*G02B 6/44* (2006.01)

(56) References Cited

U.S. PATENT DOCUMENTS

| | | | |
|---|---|---|---|
| 6,731,424 B1* | 5/2004 | Wu | H01S 5/50 |
| | | | 359/337.1 |
| 7,555,220 B2 | 6/2009 | Grubb et al. | |
| 2002/0131131 A1* | 9/2002 | Nagel | H04B 10/291 |
| | | | 398/141 |
| 2005/0196175 A1* | 9/2005 | Evangelides, Jr. | |
| | | | H04B 10/0771 |
| | | | 398/151 |
| 2005/0200943 A1* | 9/2005 | DeVincentis | G02B 6/4427 |
| | | | 359/333 |
| 2007/0053645 A1* | 3/2007 | Kordahi | H02G 15/14 |
| | | | 385/135 |
| 2007/0279133 A1* | 12/2007 | Rector | H03F 3/602 |
| | | | 330/295 |
| 2009/0169217 A1 | 7/2009 | Meagher et al. | |
| 2009/0202237 A1* | 8/2009 | Zhang | H04B 10/035 |
| | | | 398/6 |
| 2013/0089333 A1* | 4/2013 | Shen | H04B 10/506 |
| | | | 398/79 |
| 2013/0279910 A1 | 10/2013 | Ziari et al. | |
| 2016/0202423 A1* | 7/2016 | Li | G02B 6/124 |
| | | | 385/11 |
| 2019/0115658 A1* | 4/2019 | Iannotti | H01P 9/006 |
| 2019/0190231 A1* | 6/2019 | Winzer | H01S 3/08013 |
| 2019/0222307 A1* | 7/2019 | Richardson | H04B 10/0777 |
| 2019/0229803 A1* | 7/2019 | Xu | H04B 10/0777 |
| 2019/0393681 A1* | 12/2019 | Fish | G02B 6/126 |
| 2020/0073052 A1* | 3/2020 | Lin | G02B 6/4254 |
| 2020/0132930 A1* | 4/2020 | Bchir | G02B 6/12004 |

FOREIGN PATENT DOCUMENTS

| | | |
|---|---|---|
| JP | 3727048 B2 | 12/2005 |
| WO | 2004036792 A1 | 4/2004 |
| WO | 2004047318 A2 | 6/2004 |

OTHER PUBLICATIONS

International Search Report and Written Opinion for International Application No. PCT/US2019/062220 dated Feb. 25, 2020. 17 pages.

"Noisy-channel coding theorem" Wikipedia, 2018, accessed Aug. 23, 2018 (https://en.wikipedia.org/wiki/Noisy-channel_coding_theorem).

Greco, Joseph A., "Design of the High-Speed Framing, FEC, and Interleaving Hardware Used in a 5.4km Free-Space Optical Communication Experiment", Free-Space Laser Communications IX, Proc. of SPIE, vol. 7464, 2009.

Office Action with Search Report for Taiwanese Patent Application No. 108142068 dated Sep. 9, 2020. 10 pages.

* cited by examiner

LOW SIGNAL TO NOISE RATIO SUBMARINE COMMUNICATION SYSTEM

CROSS REFERENCE TO RELATED APPLICATION

This application claims the benefit of U.S. Provisional Patent Application No. 62/770,008, filed Nov. 20, 2018, the entire contents and substance of which are incorporated by reference herein.

BACKGROUND

Today the majority of intercontinental internet traffic is transmitted via optical submarine systems. Each submarine cable, and in particular very long cables such as transatlantic and transpacific connections, represent a significant investment on the order of a few hundred million dollars. Often multiple companies form consortia to share the investment and risk of an optical submarine system. For today's submarine cables, only extremely high grade components are being used, contributing to the large cost. This includes components such as repeaters (optical amplifiers), optical transmitters, and optical receivers. Recently so-called space division multiplexing (SDM) has been introduced to increase the achievable capacity by means of additional fiber pairs in the cable. However the underlying components and devices remain high cost.

SUMMARY

At least one aspect is directed to an undersea optical amplifier assembly. The amplifier assembly includes a water-tight housing and a photonic integrated circuited (PIC) disposed within the housing. The PIC includes a plurality of optical fiber inputs, each configured to receive an end of a respective optical fiber of a first fiber optic cable bundle. The PIC includes a plurality of optical fiber outputs. Each optical fiber output corresponds to a respective optical fiber input to form a fiber optic input-output pair, and is configured to receive an end of a respective optical fiber of a second fiber optic cable bundle. The PIC includes an optical amplifier optically coupled to each respective fiber optic input-output pair. Each optical amplifier includes at least one semiconductor optical amplifier. The amplifier assembly includes a first water-tight access port configured to receive the first fiber optic cable bundle and a second water-tight access port configured to receive a second fiber optic cable bundle.

At least one aspect is directed to an undersea optical communication link including a plurality of undersea optical amplifier assemblies connected in series to one another via respective fiber optic cable bundles and respective power cables. Each undersea optical amplifier assembly contains in a water-tight housing at least one photonic integrated circuit including a plurality of optical amplifiers configured to amplify optical signals received at the undersea optical amplifier assembly. The link includes a transmitter disposed at a first end of the communication link configured to output a plurality of optical signals converted from electrical signals across a plurality of optical fibers of a first fiber optic cable bundle and to output power to a first of the plurality of undersea optical amplifier assemblies. The link includes a receiver configured to receive the plurality of optical signals from a last of the plurality of undersea optical amplifier assemblies and convert the received optical signals into electrical signals.

At least one aspect is directed to a method of undersea optical communication. The method includes receiving, at each of a plurality of optical fiber inputs in a photonic integrated circuit disposed within a water-tight housing of an undersea optical amplifier assembly, a plurality of optical signals from a first plurality of optical fibers, respectively, of a first fiber optic bundle. The method includes amplifying each of the plurality of optical signals using a plurality of optical amplifiers in the photonic integrated circuit. Each optical amplifier includes at least one semiconductor optical amplifier. The method includes transmitting, at each of a plurality of optical fiber outputs in the photonic integrated circuit, the amplified optical signals into a second plurality of optical fibers of a second fiber optic bundle. Each optical fiber output corresponds to a respective optical fiber optic input to form a fiber optic input-output pair.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

This disclosure relates generally to a system and method for long-haul, subsea optical fiber telecommunications using low cost, compact semiconductor optical amplifiers (SOAs) in repeater stages. In long-haul, subsea optical fiber telecommunications, it is customary to provide repeating stages at discrete points along the optical fiber path to amplify the optical signal, thereby compensating for propagation losses through the long-haul fiber. Traditionally, high-end optical amplifiers providing high signal-to-noise ratios (SNRs) are used in the repeating stages, so that the channel capacity is maintained throughout the transmission (according to Shannon's capacity rule). Some examples of high-end optical amplifiers include optical fiber amplifiers such as erbium doped fiber amplifiers (EDFAs). However, fiber amplifiers, which are electrically operated, tend to have lower conversion efficiency as the electrical power is used to turn 'on' a pump light source (typically a bright laser diode), which is in turn used to optically amplify the signal traveling along the fiber optic cable. This optical amplification scheme presents a limitation to the number and effectiveness of fiber amplifiers that can be deployed in a subsea environment, where the electrical power limitations are stringent both to avoid underwater breakdown and also to reduce the amount of heavy, expensive copper wiring that is required to feed the amplifiers over the long-haul. Moreover, fiber amplifiers (e.g., EDFAs) employ long segments of fiber that need to be coiled around in generally high form factor packages, as the radius of curvature of the erbium doped fiber has a minimum of a few centimeters to limit optical losses in the fiber. Accordingly, it is costly and inefficient to deploy a multitude of EDFAs and similar devices over the long-haul, at deep subsea localities.

Embodiments as disclosed herein provide a paradigmatic shift in the design and operation of a long-haul telecommunication system by using compact, low cost and high efficiency SOAs for the repeater stages. SOAs operate at higher power efficiency compared to fiber amplifiers, thereby reducing substantially the electrical requirements for the sub-sea line. Further, SOAs provide wide amplification bandwidth in a compact configuration of only a few millimeters or even less. Accordingly, SOA capabilities are easily multiplexed over several fiber channels with low impact in size and power requirements for repeater stages. SOAs can also amplify optical signals over a wider bandwidth than EDFAs; for example SOAs can amplify optical signals over a bandwidth of 7-10 THz compared with 4 THz typical for an EDFA. Furthermore, due to their small size, SOAs exhibit little attenuation outside of their amplification bandwidth. Hence, multiple SOAs can be combined to amplify a single optical signal in series or parallel, where each SOA amplifies a single band or portion of a band of the optical signal. Careful engineering of the multiple SOA amplification stages can reduce or eliminate the need for equalizers as required by traditional repeaters comprising EDFAs. While the SNR of a single SOA channel may be lower than that of a fiber amplifier, the accrued effect of multiple channel amplification can be corrected at the transmitter level on the output end of the long-haul cable. Accordingly, the system can achieve a desired bit-error-rate (BER) despite the lower SNR per SOA channel by modifying the algorithm of the transmitter to distribute optical signal channels over more lower SNR SOA channels, with a resulting reduced cost over the entire long-haul deployment.

Figure 1:
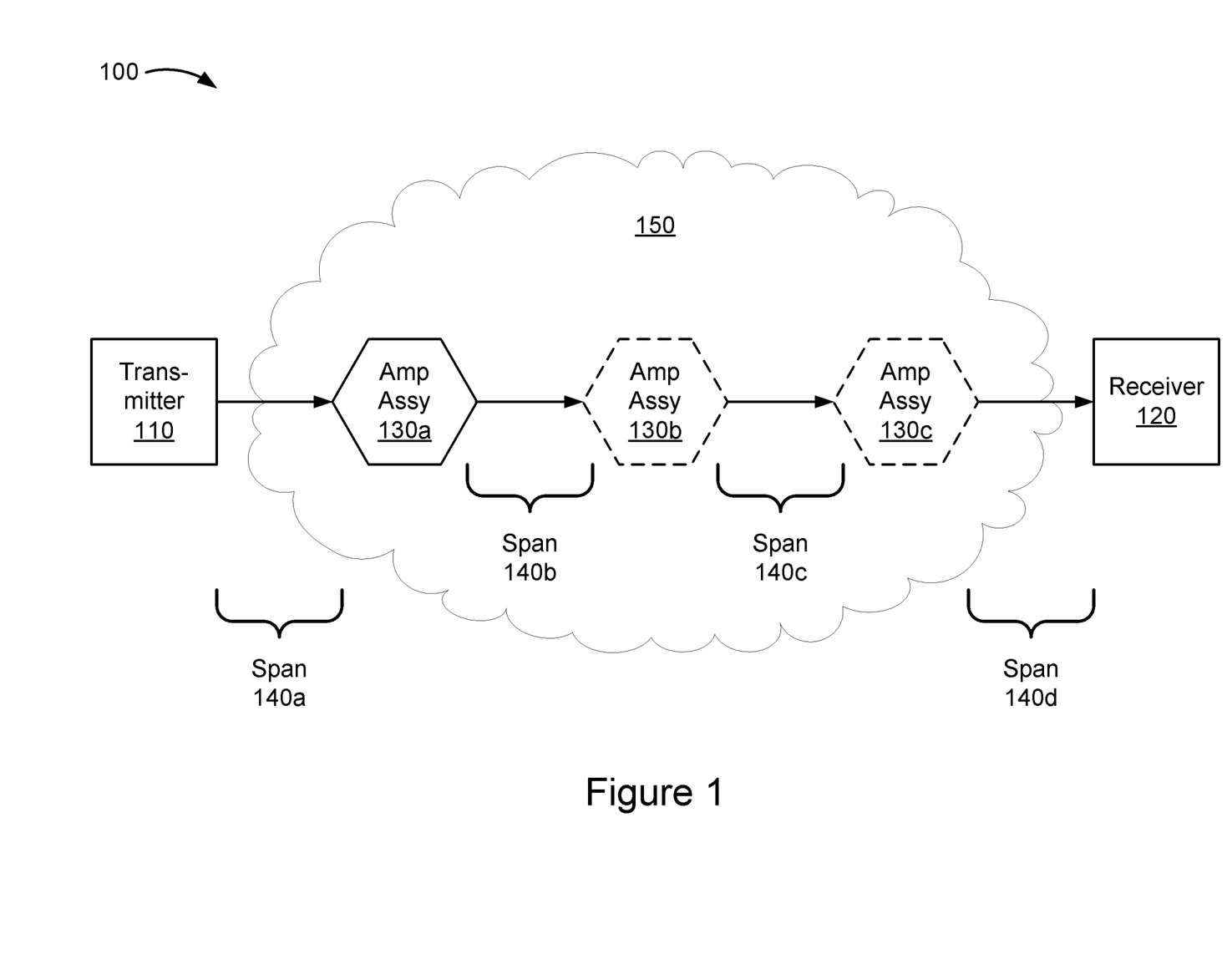
FIG. 1 is a block diagram of an undersea optical communication link, according to some implementations.

FIG. 1 is a block diagram of an undersea optical communication link 100, according to some implementations. The undersea optical communication link 100 includes a transmitter device 110 communicating with a receiver 120 via a plurality of undersea optical amplifier assemblies 130*a*, 130*b*, and 130*c* (collectively, "amplifier assemblies 130"). The amplifier assemblies 130 are connected by spans 140*a*, 140*b*, 140*c*, and 140*d* (collectively, "spans 140"). The spans 140 and amplifier assemblies 130 traverse a body of water 150 such as an ocean, sea, bay, lake, etc. Typically, the spans 140 and amplifier assemblies 130 will be on the floor or bottom of the body of water 150, but in some implementations the spans 140 and amplifier assemblies 130 can be partially or completely buried under the sea floor, suspended above the floor, or partially submerged near a surface of the water 150. The spans 140 can consist of a fiber optic bundle having a plurality of optical fibers, where each fiber can carry an optical signal or a plurality of component optical signals (e.g., a plurality of optical signal channels). In FIG. 1, the link 100 is shown to include three amplifier assemblies 130; in other implementations, however, the link 100 can include a single amplifier assembly 130 or many amplifier assemblies 130. The number of amplifier assemblies 130 can depend on the distance the link 100 must traverse between the transmitter device 110 and the receiver 120, and the optical signal power loss experienced across each span 140. An example amplifier assembly is described in further detail below with reference to FIG. 2.

The transmitter device 110 includes components for converting electrical signals to optical signals for communication across the link 100. The components can include lasers, modulators, digital-to-analog converters, electrical amplifiers, and couplers for coupling the optical signals into optical fibers. In some implementations, the transmitter device 110 can include one or more interleavers for combining a plurality of component optical signals into a single optical signal for transmission across an optical fiber of the fiber optic bundle. The interleaver is an optical component that can combine sets of optical signal channels into a composite signal stream. Use of the interleaver can increase the channel density of the optical signal. Similarly, the receiver 120 can include one or more de-interleavers for separating the optical signal into a second plurality of optical component signals. The receiver 120 can further include components and circuitry for converting the optical signals into electrical signals. The components and circuitry can include photodiodes (or other photodetectors), transimpedance amplifiers, analog-to-digital converters, and additional components such as filters and equalizers for processing the signal in the optical and/or electrical domain.

In some implementations, the transmitter device 110 and/or the receiver 120 can include an electrical power source for providing electrical power to the one or more amplifier assemblies 130. The electrical power can be provided via electrically conductive wires or cable added to the fiber optic bundle of each span 140. In some implementations, the electrical power may be provided via electrically conductive wires or cables separate and distinct from the span 140. In some implementations, the amplifier assemblies 130 can receive electrical power from an electrical power source that is separate and distinct from the transmitter device 110 and receiver 120.

Figure 2:
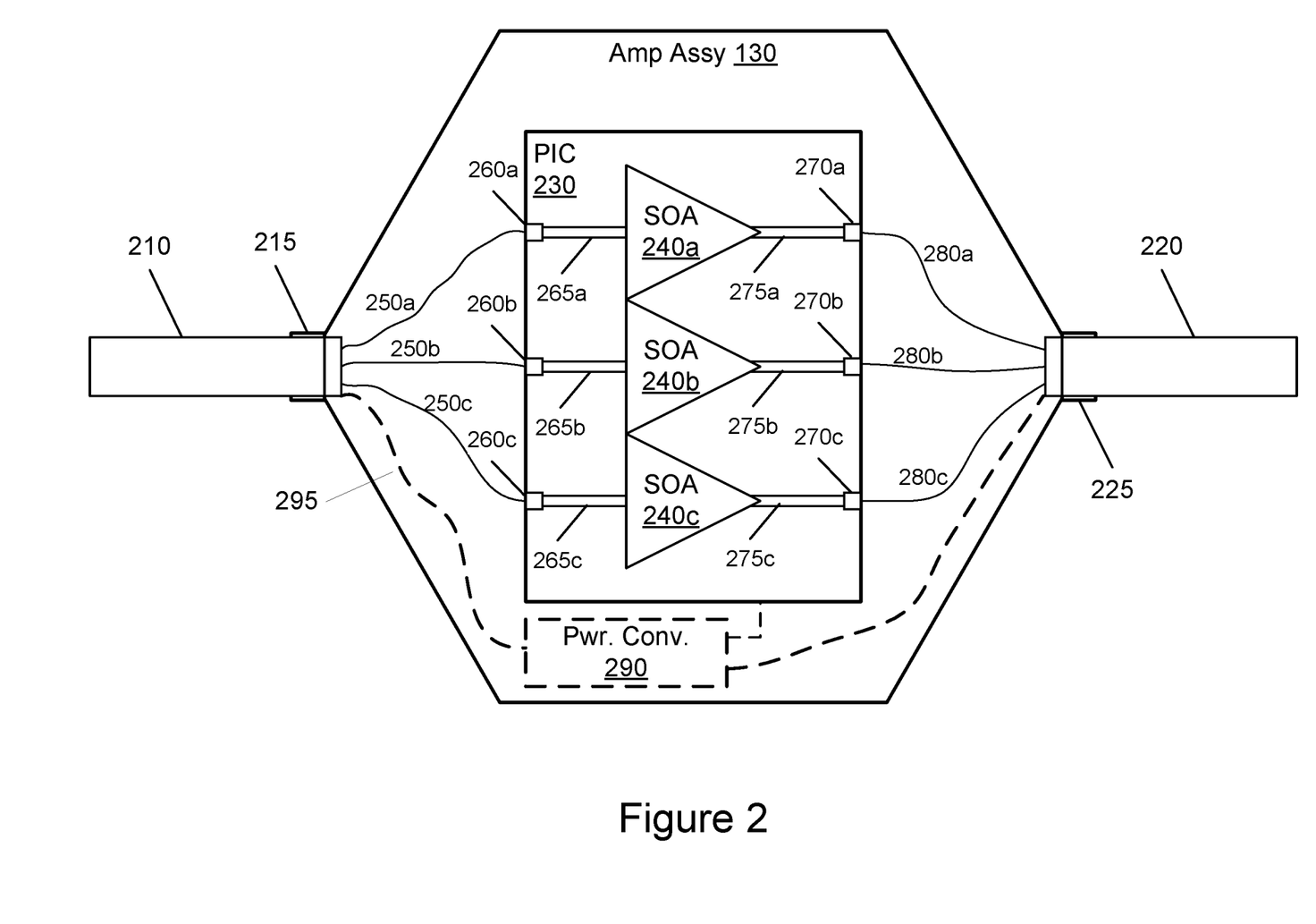
FIG. 2 is a block diagram of an undersea optical amplifier assembly for use in an undersea optical communication link, according to some implementations.

FIG. 2 is a block diagram of an undersea optical amplifier assembly 130 for use in an undersea optical communication link, according to some implementations. The amplifier assembly 130 can receive a first fiber optic bundle 210 via a first water-tight seal 215. The amplifier assembly 130 can receive a second fiber optic bundle 220 via a second water-tight seal 225. The amplifier assembly 130 includes at least one photonic integrated circuit (PIC) 230. In some implementations, the amplifier assembly 130 includes only a single PIC 230. In some implementations the amplifier assembly 130 includes many PICs 230. The amplifier assembly 130 is housed in a water-tight housing. In some implementations, the water-tight housing can be a universal joint, which, due to its limited internal space, is not typically used to house submarine amplifiers.

The PIC 230 is an integrated silicon component including optical, electrical, and/or electrical-optical components for routing and amplifying the optical signals. In some implementations, the PIC 230 can include a single photonic IC substrate. The PIC 230 has a plurality of semiconductor optical amplifiers (SOAs) 240*a*, 240*b*, and 240*c* (collectively, "SOAs 240"). Each SOA 240 receives an optical signal from an optical fiber 250*a*, 250*b*, or 250*c* (collectively, "optical fibers 250") via an optical fiber input 260*a*, 260*b*, or 260*c* (collectively, "optical fiber inputs 260") and a waveguide 265*a*, 265*b*, 265*c* (collectively, "waveguides 265"), respectively. The SOA 240 amplifies the optical signal and provides the amplified optical signal to an optical fiber 280*a*, 280*b*, 280*c* (collectively, "optical fibers 280") via a waveguide 275*a*, 275*b*, or 275*c* (collectively, "waveguides 275") and an optical fiber output 270*a*, 270*b*, or 270*c* (collectively, "optical fiber outputs 270"), respectively. Each optical fiber 250 and its corresponding optical fiber 280 forms a fiber optic input-output pair; for example, a first fiber optic input-output pair consisting of optical fibers 250*a* and 280*a*, a second fiber optic input-output pair consisting of optical fibers 250*b* and 280*b*, etc. In some implementations, the PIC 230 can include an array of 24 SOAs 240, each SOA 240 providing amplification for a single fiber optic input-output pair.

In some implementations, each SOA 240 can include amplifiers based on two-dimensional materials. In some implementations, each SOA can include a single stage of conversion from electrical to optical to improve overall conversion from electrical to optical.

Figure 3A:
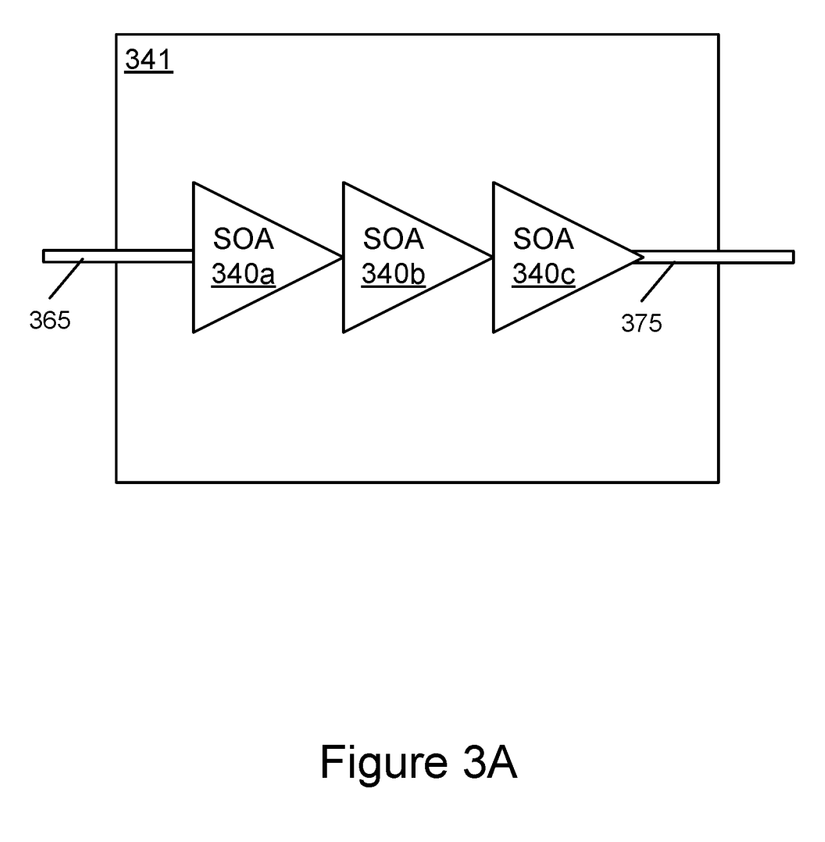
FIG. 3A shows a block diagrams of an amplifier block having a plurality of semiconductor optical amplifiers amplifying respective portions of an optical signal in series, according to some implementations.
Figure 3B:
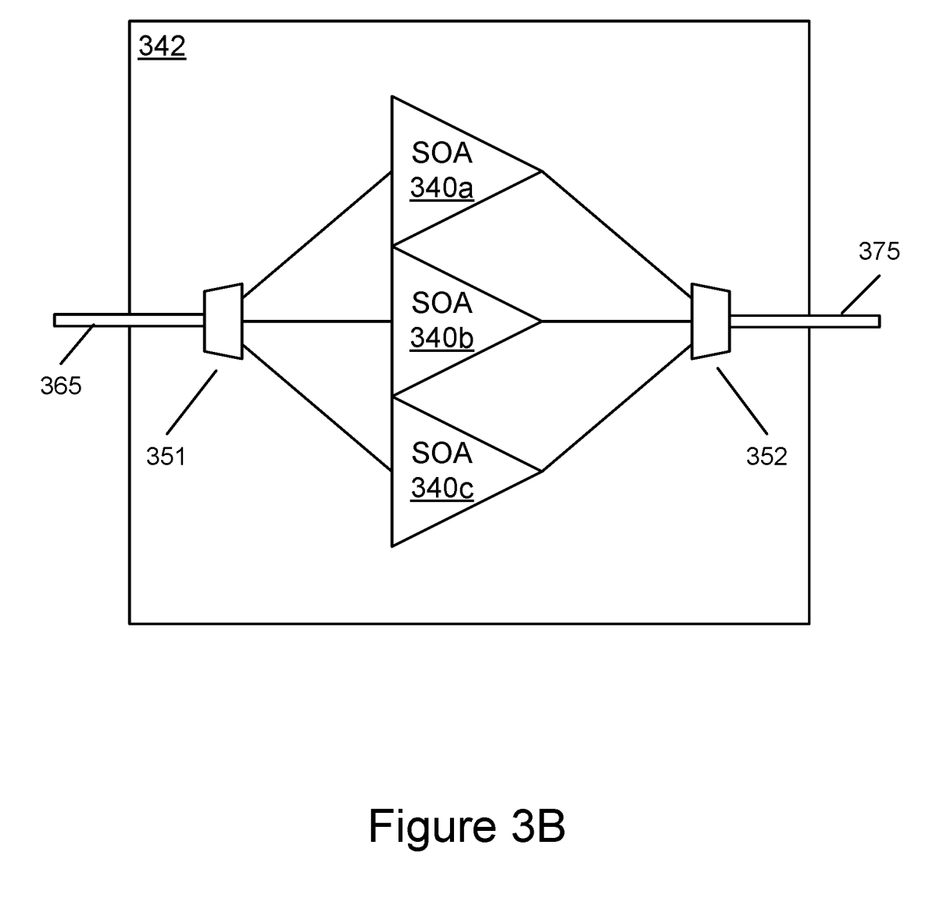
FIG. 3B is a block diagram of an amplifier block having a plurality of semiconductor optical amplifiers amplifying respective portions of an optical signal in parallel, according to some implementations.

In some implementations, each SOA 240 shown in FIG. 2 can actually be made up of multiple SOAs. The multiple SOAs of an SOA 240 can be arranged in series (as shown in FIG. 3A) or parallel (as shown in FIG. 3B). These implementations are described in further detail with reference to FIGS. 3A and 3B below.

The optical fiber inputs 260 and optical fiber outputs 270 can be couplers suitable for coupling the optical signals from the optical fibers to or from the waveguides on the PIC 230; e.g., edge couplers or grating couplers.

The amplifier assembly 130 shown in FIG. 2 is unidirectional; that is, it amplifies optical signals from the first fiber optic bundle 210 and transmits the amplified optical signals to the second fiber optic bundle 220. In some implementations, however, the amplifier assembly 130 can be bi-directional; that is, amplifying signals traveling in each direction, either along the same fiber or different fibers. Optical circulators can be used to de-multiplex optical signals traveling in opposite directions along a single optical fiber. In some implementations, the PIC 230 can include SOAs 240 amplifying optical signals traveling in both directions. In some implementations, the amplifier assembly 130 can include multiple PICs 230, with each PIC 230 having SOAs 240 amplifying optical signals traveling in one direction.

In some implementations, the amplifier assembly 130 can include a power convertor 290 for receiving electrical power from an electrically conductive wire or cable 295 included in one of the fiber optic bundles 210 or elsewhere. The power convertor 290 can convert and/or regulate the electrical power provided via the cable 295, and provide electrical power to the SOAs 240 on the PIC. In some implementations, each amplifier assembly 130 can receive electrical power in a daisy chain fashion where an electrical cable successively passes through and provides power to a plurality of amplifier assemblies 130.

FIG. 3A shows a block diagrams of an amplifier block 341 having a plurality of semiconductor optical amplifiers 340 amplifying respective portions of an optical signal in series, according to some implementations. The amplifier block 341 can serve, for example, as one of the SOAs 240 shown in FIG. 2. The amplifier block 341 includes SOAs 340*a*, 340*b*, and 340*c* (collectively, "SOAs 340") arranged in series with respect to one another. The amplifier block 341 can amplify an optical signal received over a first waveguide 365, and transmit the amplified optical signal over a second waveguide 375. In some implementations, the SOAs 340 can each amplify a different band of an optical signal, such that the overall gain is flat or substantially flat over the bandwidth of the optical signal. Furthermore, the relatively flat gain response over the bandwidth of the optical signal can reduce or eliminate the need for optical equalizers, thereby preserving optical power and reducing the amount of amplification (or number of amplifiers in the link) required.

FIG. 3B is a block diagram of an amplifier block 342 having a plurality of semiconductor optical amplifiers 340 amplifying respective portions of an optical signal in parallel, according to some implementations. The amplifier block 342 can serve, for example, as one of the SOAs 240 shown in FIG. 2. The amplifier block 341 includes SOAs 340*a*, 340*b*, and 340*c* (collectively, "SOAs 340") connected to each other in parallel. The amplifier block 342 can amplify an optical signal received over a first waveguide 365, and transmit the amplified optical signal over a second waveguide 375. The amplifier block 342 includes an optical splitter 351 to split the optical signal received from the waveguide 365 and provide a portion of the optical signal to each of the SOAs 340. The amplifier block 342 also includes an optical coupler 352 for recombining the amplified optical signal portions before transmitting the amplified optical signal to the waveguide 375.

In some implementations, in either amplifier block 341 or 342, the SOAs 340 can each amplify a different band of an optical signal, such that the overall gain is flat or substantially flat over the bandwidth of the optical signal. Furthermore, the relatively flat gain response over the bandwidth of the optical signal can reduce or eliminate the need for optical equalizers, thereby preserving optical power and reducing the amount of amplification (or number of amplifiers in the link) required. In some implementations, each SOA can amplify an optical band, such as the conventional (C-band), the long-wavelength band (L-band), the short-wavelength band (S-band), O-band, etc. In some implementations, each SOA can amplify a portion of an optical transmission frequency band.

Figure 4:
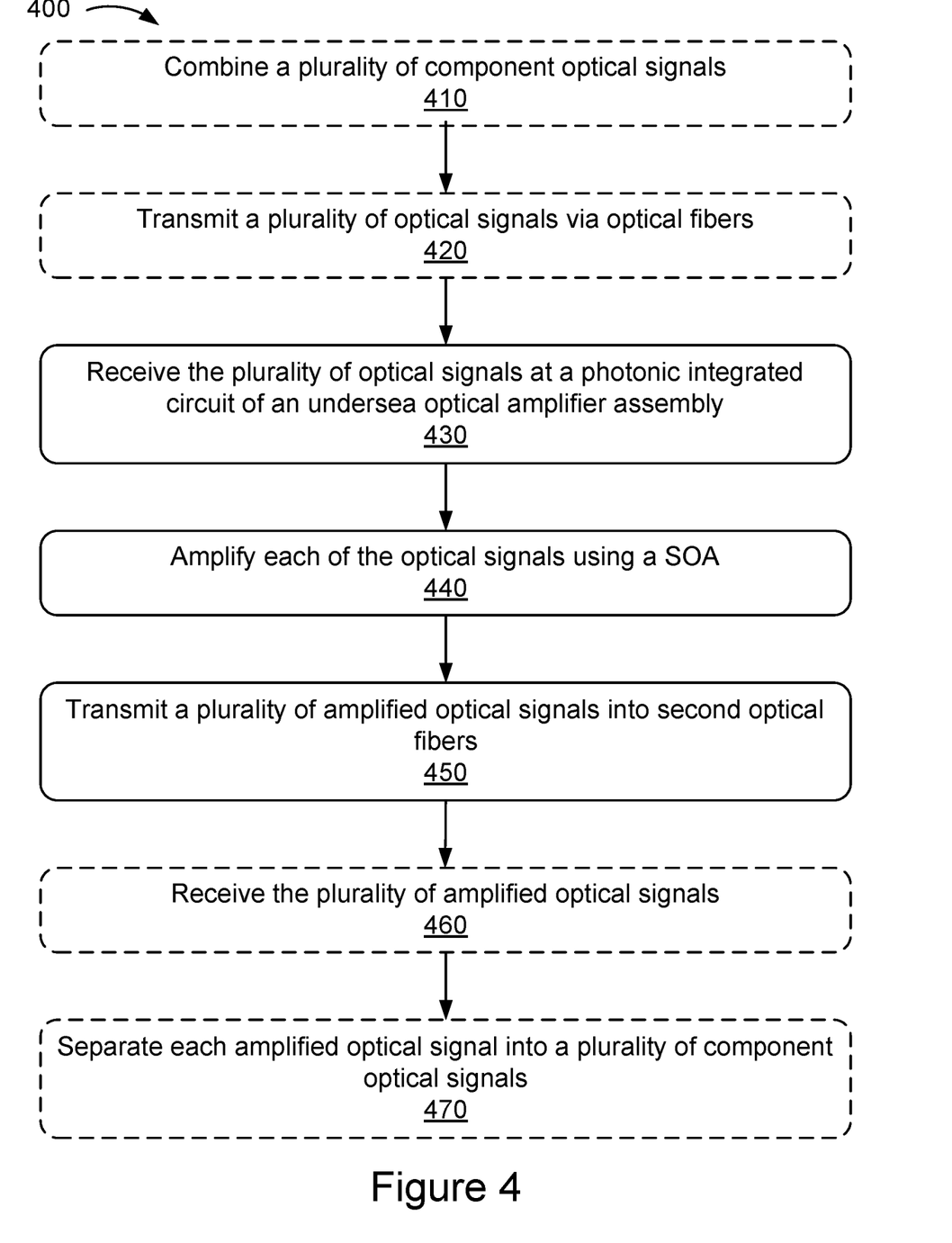
FIG. 4 shows a flowchart of an example method of undersea optical communication, according to some implementations.

FIG. 4 shows a flowchart of an example method 400 of undersea optical communication, according to some implementations. The method 400 can be performed by an amplifier assembly such as the amplifier assembly 130 previously described, and/or an undersea optical communication system such as the optical communication link 100 previously described. The method 400 optionally includes combining a plurality of component optical signals using an interleaver (stage 410). The method 400 optionally includes transmitting a plurality of optical signals via optical fibers (stage 420). The method 400 includes receiving the plurality of optical signals at a photonic integrated circuit of an undersea optical amplifier assembly (stage 430). The method 400 includes amplifying each of the optical signals using a semiconductor optical amplifier (SOA) (stage 440). The method 400 includes transmitting a plurality of amplified optical signals into second optical fibers (stage 450). The method 400 optionally includes receiving the plurality of amplified optical signals at a receiver (stage 460). The method 400 optionally includes separating each amplified optical signal into a plurality of component optical signals using a de-interleaver (stage 470).

In some implementations, the method 400 can optionally include combining a plurality of component optical signals using an interleaver (stage 410). The combining can be performed using an interleaver of a transmitter, such as the transmitter device 110 previously described. The interleaver can take a pair (or more) of optical signals and combine them into a single optical signal. In some implementations, the transmitter can include multiple interleavers, one for each optical signal to be generated and transmitted along a fiber optic bundle to an undersea optical amplifier assembly.

In some implementations, the method 400 can optionally include transmitting a plurality of optical signals via optical fibers (stage 420). The transmitter can be disposed at a first end of a communication link, and configured to transmit each of the plurality of optical signals along the fiber optic bundle to the first of one or more undersea optical amplifier assemblies.

The method 400 includes receiving the plurality of optical signals at a photonic integrated circuit of an undersea optical amplifier assembly (stage 430). An undersea optical amplifier assembly, such as the amplifier assembly 130 previously described, can receive the plurality of optical signals transmitted by the transmitter. The amplifier assembly includes at least one photonic integrated circuit (PIC), such as the PIC 230 previously described, having a plurality of optical fiber inputs. The PIC can be housed inside a water-tight housing of the amplifier assembly with a water-tight seal for receiving the fiber optic bundle. Each of the optical fiber inputs can receive an optical fiber from the fiber optic bundle and couple the optical signal into the PIC. In some implementations, the method 400 can additionally include receiving electrical power via electrical wires or cables received via the water-tight seal. In some implementations, the method 400 can include converting and/or regulating the received electrical power into a form usable by the components on the PIC.

The method 400 includes amplifying each of the optical signals using a semiconductor optical amplifier (SOA) (stage 440). The PIC includes a plurality of SOAs configured to amplify the optical signals. In some implementations, the PIC includes a plurality of SOA blocks, where each SOA block amplifies an optical signal for a single fiber optic input-output pair. Each SOA block can include a plurality of SOAs. The SOAs can be arranged in series or parallel, with each SOA of an SOA block amplifying a different wavelength band of the optical signal such that the SOAs provide amplification that is flat or substantially flat across the overall bandwidth of the optical signal. In implementations where the SOAs of an SOA block are arranged in parallel, the SOA block can include an optical splitter for splitting the optical signal and sending a portion to each of the SOAs, and an optical combiner for combining the amplified portions of the optical signal. Each SOA or SOA block can output the amplified optical signal to an optical fiber output of the PIC.

The method 400 includes transmitting a plurality of amplified optical signals into second optical fibers (stage 450). The amplifier assembly can route each amplified optical signal from its optical fiber output on the PIC to a second plurality of optical fibers and into a second fiber optic bundle. Each optical fiber output corresponds to a respective optical fiber optic input to form a fiber optic input-output pair.

In some implementations, the receiving, amplifying, and transmitting stages 430-450 can be repeated at one or more or many additional amplifier assemblies along the undersea optical communication link.

In some implementations, the method 400 can optionally include receiving the plurality of amplified optical signals at a receiver (stage 460). A receiver, such as the receiver 120 previously described, can be disposed at a second end of the communication link, and configured to receive the plurality of amplified optical signals from the amplifier assembly, or from a last of a plurality of amplifier assemblies. The receiver can convert converting the received optical signals into electrical signals using the receiver.

In some implementations, the method 400 can optionally include separating each amplified optical signal into a plurality of component optical signals using a de-interleaver (stage 470). In implementations where the transmitter interleaves a plurality of component optical signals to generate each optical signal, the receiver can include a complementary de-interleaver for separating each of the amplified optical signals into a second plurality of component optical signals. The receiver can convert each of the second plurality of component optical signals into one or more electrical signals.

In some implementations, the method 400 can include more or fewer stages or steps without departing from the scope of the disclosure.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. An undersea optical amplifier assembly, comprising:
   a water-tight housing;
   a photonic integrated circuited (PIC) disposed within the housing, the PIC including:

a plurality of optical fiber inputs, each configured to receive an end of a respective optical fiber of a first fiber optic cable bundle;

a plurality of optical fiber outputs, wherein each optical fiber output:

corresponds to a respective optical fiber input to form a fiber optic input-output pair, and is configured to receive an end of a respective optical fiber of a second fiber optic cable bundle; and an optical amplifier optically coupled to each respective fiber optic input-output pair by a direct physical coupling comprising a first waveguide external to the amplifier, internal to the PIC, and coupling the fiber optic input to the amplifier, and a second waveguide external to the amplifier, internal to the PIC, and coupling the fiber optic output to the amplifier, such that each of the optical fibers of the first fiber optic cable bundle is physically coupled by the PIC to a respective one of the optical fibers of the second fiber optic cable bundle, and each optical amplifier including at least one semiconductor optical amplifier;

a first water-tight access port configured to receive the first fiber optic cable bundle; and a second water-tight access port configured to receive a second fiber optic cable bundle.

2. The undersea optical amplifier assembly of claim 1, wherein each optical amplifier for each fiber optic input-output pair comprises a plurality of semiconductor optical amplifiers.

3. The undersea optical amplifier assembly of claim 2, wherein each semiconductor optical amplifier coupled to a given fiber optic input-output pair is configured to amplify a different frequency band of the optical signal.

4. The undersea optical amplifier assembly of claim 3, wherein the plurality of semiconductor optical amplifiers coupled to a given fiber optic input-output pair are connected in series with respect to one another.

5. The undersea optical amplifier assembly of claim 3, wherein the plurality of semiconductor optical amplifiers coupled to a given fiber optic input-output pair are connected to the fiber optic input-output pair in parallel with each other.

6. The undersea optical amplifier assembly of claim 5, wherein the PIC comprises a plurality of optical combiners, each optical combiner configured to combine the outputs of the semiconductor optical amplifiers associated with one of the fiber optic input-output pairs and to output the combined optical signal to the optical fiber output of the fiber optic input-output pair.

7. The undersea optical amplifier assembly of claim 1, wherein the first water-tight access port is further configured to receive a power cable.

8. The undersea optical amplifier assembly of claim 7, further comprising a power converter for converting power received via the power cable to a voltage suitable for powering the PIC.

9. An undersea optical communication link comprising:

a plurality of undersea optical amplifier assemblies connected in series to one another via respective fiber optic cable bundles and respective power cables, wherein each undersea optical amplifier assembly is coupled to a first fiber optic cable bundle and a second fiber optic cable bundle, and contains in a water-tight housing at least one photonic integrated circuit (PIC) including a plurality of optical amplifiers configured to amplify optical signals received at the undersea optical amplifier assembly, and wherein each optical amplifier receives one or more of the optical signals via a direct physical coupling comprising a first waveguide external to the amplifier, internal to the PIC, and coupling a fiber optic input to the amplifier, and a second waveguide external to the amplifier, internal to the PIC, and coupling a fiber optic output to the amplifier, such that a plurality of optical fibers of the first fiber optic cable bundle are physically coupled by the PIC to respective optical fibers of the second fiber optic cable bundle, and;

a transmitter disposed at a first end of the communication link configured to output a plurality of optical signals converted from electrical signals across a plurality of optical fibers of a first fiber optic cable bundle and to output power to a first of the plurality of undersea optical amplifier assemblies;

a receiver configured to receive the plurality of optical signals from a last of the plurality of undersea optical amplifier assemblies and convert the received optical signals into electrical signals.

10. The undersea optical communication link of claim 9, wherein:

the transmitter includes, for each optical fiber of the first fiber optic cable bundle, an interleaver configured to combine a first plurality of component optical signals into one of the plurality of optical signals; and the receiver includes, for each optical fiber of a second fiber optic cable bundle, a de-interleaver configured to separate one of the plurality of optical signals into a second plurality of component optical signals.

11. The undersea optical communication link of claim 9, wherein each watertight housing includes a single photonic integrated circuit.

12. The undersea optical amplifier link of claim 9, wherein each optical amplifier for each fiber optic input-output pair comprises a plurality of semiconductor optical amplifiers.

13. The undersea optical amplifier link of claim 12, wherein each semiconductor optical amplifier coupled to a given fiber optic input-output pair is configured to amplify an optical signal in a different frequency band.

14. The undersea optical amplifier link of claim 13, wherein the plurality of semiconductor optical amplifiers coupled to a given fiber optic input-output pair are connected in series with respect to one another.

15. The undersea optical amplifier link of claim 13, wherein the plurality of semiconductor optical amplifiers coupled to a given fiber optic input-output pair are connected to the fiber optic input-output pair in parallel to one another.

16. The undersea optical amplifier link of claim 15, wherein the photonic integrated circuit comprises a plurality of optical combiners, each optical combiner configured to combine the outputs of the semiconductor optical amplifiers associated with one of the fiber optic input-output pairs and to output the combined optical signal to the optical fiber output of the fiber optic input-output pair.

17. The undersea optical amplifier link of claim 11, wherein the first water-tight access port is further configured to receive a power cable.

18. The undersea optical amplifier link of claim 17, further comprising a power converter for converting power received via the power cable to a voltage suitable for powering the PIC.

19. A method of undersea optical communication, comprising:
  receiving, at each of a plurality of optical fiber inputs in a photonic integrated circuit (PIC) disposed within a water-tight housing of an undersea optical amplifier assembly, a plurality of optical signals from a first plurality of optical fibers, respectively, of a first fiber optic bundle;
  amplifying each of the plurality of optical signals using a plurality of optical amplifiers in the PIC, wherein each optical amplifier includes at least one semiconductor optical amplifier, and wherein each optical amplifier receives one or more of the optical signals via a direct physical coupling; and
  transmitting, at each of a plurality of optical fiber outputs in the PIC, the amplified optical signals into a second plurality of optical fibers of a second fiber optic bundle, wherein each optical fiber output corresponds to a respective optical fiber optic input to form a fiber optic input-output pair,
  wherein for each optical amplifier the direct physical coupling comprises a first waveguide external to the amplifier, internal to the PIC, and coupling the fiber optic input to the amplifier, and a second waveguide external to the amplifier, internal to the PIC, and coupling the fiber optic output to the amplifier, such that each of the fibers of the first plurality of optical fibers is physically coupled by the PIC to a respective one of the fibers of the second plurality of optical fibers.

20. The method of claim 19, comprising amplifying each of the plurality of optical signals using a plurality of semiconductor optical amplifiers.

21. The method of claim 20, wherein each of the plurality of semiconductor optical amplifiers amplifying an optical signal is configured to amplify a different frequency band of the optical signal.

22. The method of claim 21, wherein the plurality of semiconductor optical amplifiers amplifying the optical signal are connected in series with respect to one another.

23. The method of claim 21, wherein the plurality of semiconductor optical amplifiers amplifying the optical signal are connected in parallel with each other.

24. The method of claim 23, comprising:
  combining the outputs of the plurality of semiconductor optical amplifiers amplifying the optical signal using a combiner in the photonic integrated circuit; and
  outputting the combined optical signal to an optical fiber output.

25. The method of claim 19, comprising:
  receiving the first fiber optic bundle via a first water-tight access port; and
  receiving a power cable via the first water-tight access port.

26. The method of claim 25, comprising converting power received via the power cable to a voltage suitable for powering the photonic integrated circuit.

27. The method of claim 25, wherein the undersea optical amplifier assembly is one of a plurality of undersea optical amplifier assemblies, the method comprising:
  transmitting, using a transmitter disposed at a first end of a communication link, the plurality of optical signals to the undersea optical amplifier assembly via the first plurality of optical fibers of the first fiber optic bundle;
  receiving, using a receiver disposed at a second end of the communication link, the plurality of optical signals from a last of the plurality of undersea optical amplifier assemblies; and
  converting the received optical signals into electrical signals.

28. The method of claim 27, comprising:
  combining, using an interleaver of the transmitter, for each optical fiber of the first fiber optic cable bundle, a first plurality of component optical signals into one of the plurality of optical signals; and
  separating, using a de-interleaver of the receiver, for each optical fiber of a second fiber optic cable bundle, to separate one of the plurality of optical signals into a second plurality of component optical signals.

* * * * *